United States Patent
Lane et al.

(10) Patent No.: US 7,204,155 B2
(45) Date of Patent: Apr. 17, 2007

(54) METHOD AND APPARATUS FOR PRESSURE CONTROL AND FLOW MEASUREMENT

(75) Inventors: John Lane, San Jose, CA (US); Ralph H. M. Straube, Mountain View, CA (US); Chris Melcer, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/475,805

(22) Filed: Jun. 27, 2006

(65) Prior Publication Data

US 2006/0243060 A1 Nov. 2, 2006

Related U.S. Application Data

(63) Continuation of application No. 10/838,175, filed on May 3, 2004.

(60) Provisional application No. 60/527,428, filed on Dec. 4, 2003.

(51) Int. Cl.
*G01F 1/00* (2006.01)

(52) U.S. Cl. ...................................................... 73/861

(58) Field of Classification Search ............. 73/204.22, 73/861.42, 861.52, 861, 487; 137/487.5, 137/488
See application file for complete search history.

(56) References Cited

U.S. PATENT DOCUMENTS

| | | |
|---|---|---|
| 4,687,020 A | 8/1987 | Doyle |
| 5,062,446 A | 11/1991 | Anderson |
| 5,129,418 A | 7/1992 | Shimomura et al. |
| 5,141,021 A | 8/1992 | Shimomura et al. |
| 5,190,068 A | 3/1993 | Philbin |
| 5,293,778 A | 3/1994 | Schneiter |
| 5,303,731 A | 4/1994 | Vavra et al. |
| 5,524,084 A | 6/1996 | Wang et al. |
| 5,911,238 A | 6/1999 | Bump et al. |
| 5,925,829 A | 7/1999 | Laragione et al. |
| 5,944,048 A | 8/1999 | Bump et al. |
| 5,966,499 A | 10/1999 | Hinkle et al. |
| 6,119,710 A | 9/2000 | Brown |
| 6,138,708 A | 10/2000 | Waldbusser |
| 6,216,726 B1 | 4/2001 | Brown et al. |
| 6,269,692 B1 | 8/2001 | Drexel et al. |
| 6,343,617 B1 | 2/2002 | Tinsley et al. |
| 6,532,796 B1 | 3/2003 | Ikeda |
| 6,640,822 B2 | 11/2003 | Tinsley et al. |
| 6,681,787 B2 | 1/2004 | Tinsley et al. |
| 6,712,084 B2 | 3/2004 | Shajii et al. |

(Continued)

*Primary Examiner*—Harshad Patel
(74) *Attorney, Agent, or Firm*—Patterson & Sheridan, LLP

(57) ABSTRACT

A method and apparatus for gas control is provided. The apparatus may be used for controlling gases delivered to a chamber, controlling the chamber pressure, controlling the delivery of backside gas between a substrate and substrate support and the like. In one embodiment, an apparatus for controlling gas control includes at least a first flow sensor having a control valve, a first pressure sensor and at least a second pressure sensor. An inlet of the first flow sensor is adapted for coupling to a gas supply. A control valve is coupled to an outlet of the flow sensor. The first pressure sensor is adapted to sense a metric indicative of the pressure upstream of the first flow sensor. The second pressure sensor is adapted to sense a metric indicative of the pressure downstream of the control valve.

24 Claims, 7 Drawing Sheets

U.S. PATENT DOCUMENTS

| | | |
|---|---|---|
| 2002/0046612 A1 | 4/2002 | Mudd |
| 2002/0114732 A1 | 8/2002 | Vyers |
| 2002/0117202 A1 | 8/2002 | Tinsley et al. |
| 2002/0117212 A1 | 8/2002 | Vyers et al. |
| 2002/0139418 A1 | 10/2002 | Tinsley et al. |
| 2002/0179149 A1 | 12/2002 | Ohmi et al. |
| 2002/0198668 A1 | 12/2002 | Lull et al. |
| 2003/0234039 A1 | 12/2003 | Shajii et al. |
| 2003/0234048 A1 | 12/2003 | Shajii et al. |
| 2003/0236592 A1 | 12/2003 | Shajii et al. |
| 2003/0236638 A1 | 12/2003 | Shajii et al. |
| 2003/0236643 A1 | 12/2003 | Shajii et al. |
| 2004/0074311 A1 | 4/2004 | Lull et al. |
| 2004/0083807 A1 | 5/2004 | Mudd et al. |
| 2004/0128021 A1 | 7/2004 | Klekotka |
| 2005/0120805 A1 | 6/2005 | Lane et al. |

METHOD AND APPARATUS FOR PRESSURE CONTROL AND FLOW MEASUREMENT

CROSS-REFERENCE TO RELATED APPLICATIONS

This application is a continuation of U.S. patent application Ser. No. 10/838,175, filed May 3, 2004, which claims benefit of U.S. provisional patent application Ser. No. 60/527,428, filed Dec. 4, 2003. Each of the aforementioned related patent applications is herein incorporated by reference.

BACKGROUND OF THE INVENTION

1. Field of the Invention

Embodiments of the present invention generally relate to a method and apparatus for controlling pressure and measuring flow. More specifically, embodiments of the invention generally relate to a method and apparatus for controlling gas provided between a substrate and a substrate support in a semiconductor processing chamber or to a semiconductor processing chamber.

2. Description of the Related Art

Substrate temperature is an important process control attribute critical to many microelectronic device fabrication processes. Providing gas between the substrate and a substrate support in a semiconductor processing chamber is a well-known method for improving heat transfer between the substrate and the substrate support, thereby enhancing the precision and uniformity of substrate temperatures.

FIG. 1 depicts a simplified schematic of a conventional semiconductor processing chamber 150 having a gas delivery system 100 shown providing backside gas between a substrate 154 and a substrate support 152 disposed in the processing chamber 150. The processing chamber 150 may be configured to perform chemical vapor deposition (CVD), physical vapor deposition (PVD), etch chamber or other vacuum processing technique. Process gas delivery systems, pumping systems and the like for controlling processes performed within the processing chamber are well-known and have been omitted for the sake of brevity.

The substrate support 152 generally includes a passage 156 formed therethrough for delivering a heat transfer gas (hereinafter referred to as backside gas) to an area 158 defined between the substrate 154 and substrate support 152. The size of the area 158 has been exaggerated for clarity. The backside gas, such as helium or another gas is generally provided by the gas delivery system 100.

The gas delivery system 100 located outside the processing chamber 150 and includes a gas supply 104 and control circuit 102. The delivery of backside gas from the supply 104 to the area 158 is regulated by a control circuit 102. A shut-off valve 106 is generally provided between the supply 104 and control circuit 102.

The control circuit 102 generally includes a thermal flow sensor 110, control valve 112, a pressure sensor 114 and a restrictor 118. An inlet line 120 is coupled to an inlet of the flow sensor 110 and facilitates coupling the control circuit to the shut-off valve 106. A first intermediate line 122 couples an outlet of the flow sensor 110 to the control valve 112. A second intermediate line 124 couples an outlet of the control valve 112 to an outlet line 126. The outlet line 126 facilitates coupling the control circuit 102 to that passage 156 to that gas provided by the supply 104 may be delivered in a regulated manner to the area 158 between substrate 154 and substrate support 152. A pressure sensor 114 is coupled to the second intermediate line 124 and is adapted to provide a metric of pressure of the gas within the second intermediate line 124.

A bypass line 128 is teed into the outlet line 126 and is coupled to a vacuum source 116. A restrictor 118, such as a needle valve, is provided in series with the bypass line 128 to regulate the flow therethrough.

In operation, the control circuit 102 is set to a predefined pressure measured by the pressure sensor 114. The flow sensor 110 measures the flow of gas to the control valve 112. The control valve 112 is modulated in response to pressure variations as detected by the pressure sensor 114, such that the pressure of gas delivered to the area 158 between the substrate 154 and the substrate support 152 is provided at a predefined pressure.

Although this design has proven to control pressure in this application, field experience with the existing technology has increased the demand for more accurate measurement of flow. In addition accelerated response to change in pressure set points is needed to reduce process cycle times. For example, gas temperature and/or pressure fluctuations upstream of the gas delivery system may make the flow through the flow sensor unstable, thereby reducing the accuracy of the correlation between the flow indicated and the actual flow to both the area between the substrate and substrate support and the restrictor. Additionally, variation in the vacuum provided by the vacuum source may impact the flow through the restrictor, which may falsely indicate or contribute to erroneous interpretation of the amount of gas disposed between substrate and substrate support. In critical applications, the gas available as a heat transfer medium between the substrate and substrate support may vary, leading to deviation in substrate to substrate process performance.

In addition, the system as described in FIG. 1 is unable to determine the rate of gas flowing into the area between the substrate support and substrate or to determine small variations in the rate of gas leakage between the substrate support and substrate that may cause the heat transfer characteristics and uniformity to vary, thereby resulting in unwanted variation in processing performance. Thus, it would be desirable to know in addition to pressure the rate of gas flow to the substrate support.

Therefore, there is a need for an improved method and apparatus for controlling the delivery of backside gas in a semiconductor processing system.

Chamber pressure control is an equally important process control attribute. Throttle valves are typically placed between the chamber and a vacuum pump-to control chamber pressure. In these applications a chamber pressure gage provides feedback to the throttle valve controller. However in an application where the conductance between the throttle valve and the chamber is much smaller then the controllable conductance of the throttle valve, it is not possible to control chamber pressure with a throttle valve between the chamber and a vacuum pump. Therefore, there is a need for a method and apparatus for controlling the delivery of gas into a chamber such that the delivery rate results in the desired chamber pressure.

SUMMARY OF THE INVENTION

A method and apparatus for gas control is provided. The method and apparatus may be used for controlling gases delivered to a chamber, controlling the chamber pressure, controlling the delivery of backside gas between a substrate and substrate support and the like. In one embodiment, an apparatus for controlling gas control includes at least a first flow sensor having a control valve, a first pressure sensor and a second pressure sensor. An inlet of the first pressure sensor is adapted for coupling to a gas supply. A control valve is coupled to an outlet of the flow sensor. The first pressure sensor is adapted to sense a metric indicative of the pressure upstream of the first flow sensor. A second pressure sensor is adapted to sense a metric indicative of the pressure downstream of the control valve.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
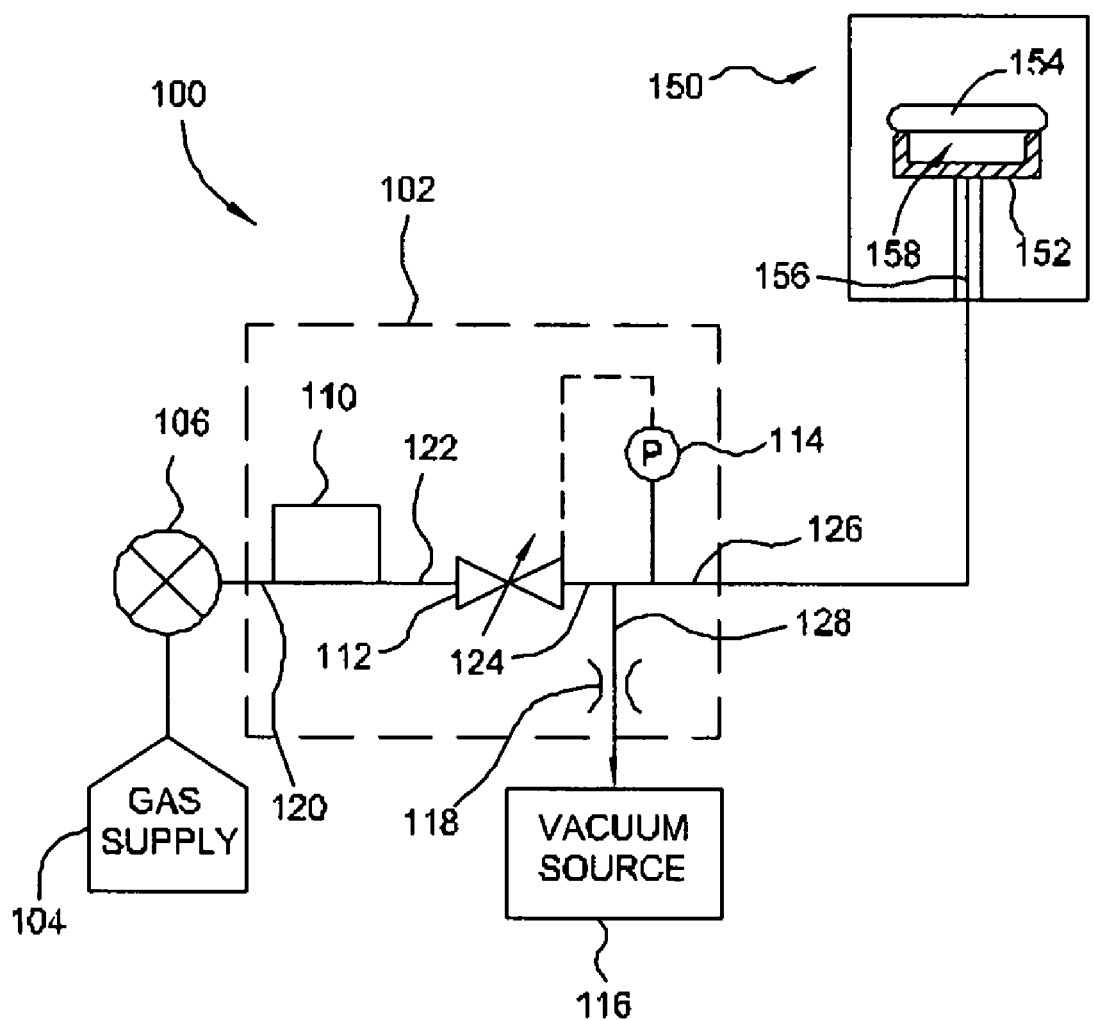
FIG. 1 is a simplified schematic of a conventional semiconductor processing chamber and gas delivery system.
Figure 2:
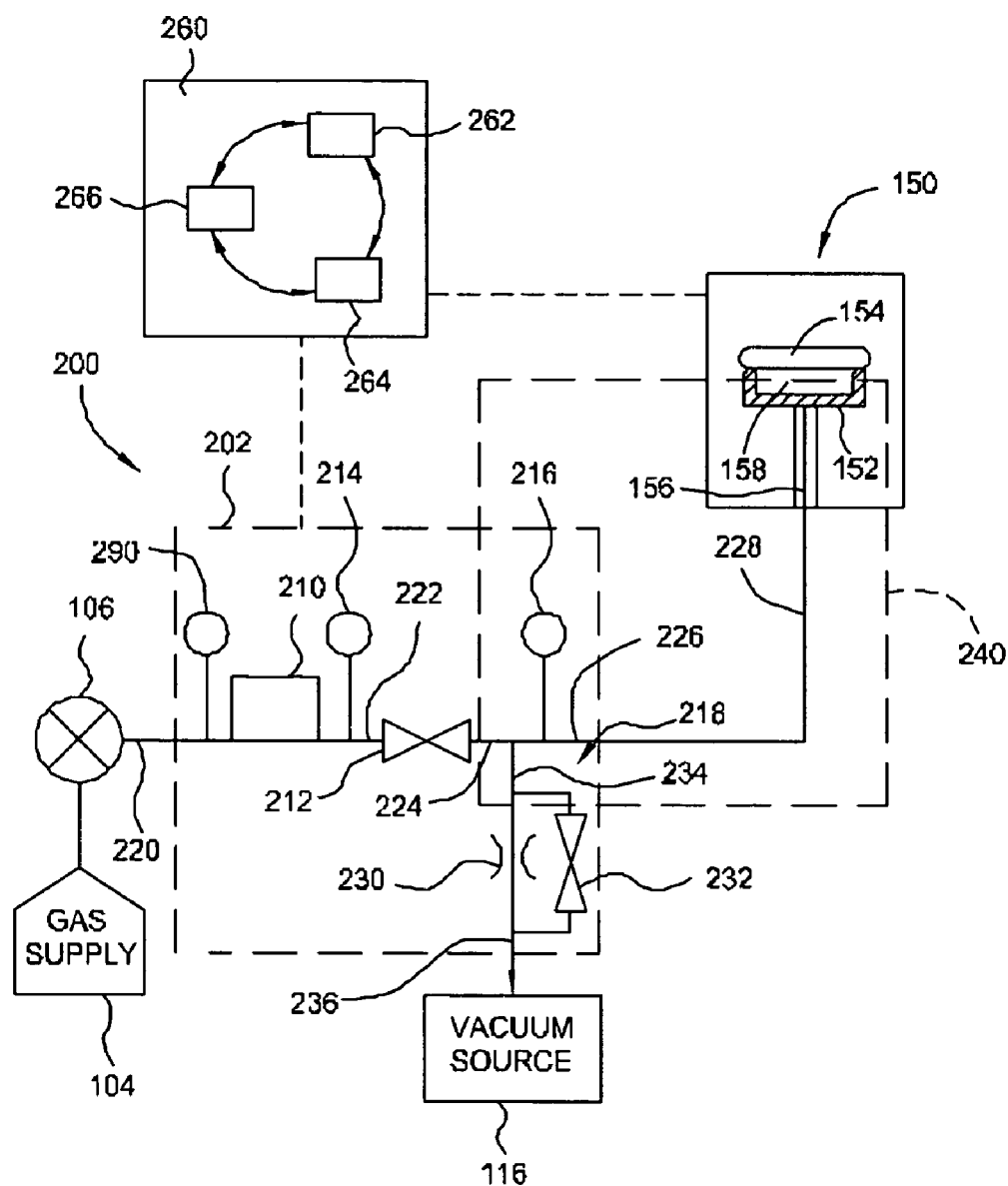
FIG. 2 is a simplified schematic of one embodiment of a gas delivery system of the invention coupled to an exemplary a semiconductor processing chamber.

FIG. 2 depicts a simplified schematic of one embodiment of a gas delivery system 200 of the invention coupled to an exemplary a semiconductor processing chamber 150. As described above, the processing chamber 150 includes a substrate support 152 disposed therein which supports a substrate 154 during processing. The processing chamber 150 may be configured to perform chemical vapor deposition (CVD), physical vapor deposition (PVD), etch chamber or other vacuum processing technique. Process gas delivery systems, pumping systems and the like for controlling processes performed within the processing chamber are well-known and have been omitted for the sake of brevity.

The substrate support 152 generally includes a passage 156 formed therethrough for delivering a heat transfer gas (hereinafter referred to as backside gas) to an area 158 defined between the substrate 154 and substrate support 152. The size of the area 158 has been exaggerated in FIG. 2 for clarity. The backside gas, such as helium, nitrogen, argon or another gas is generally provided by the gas delivery system 200.

The gas delivery system 200 is located outside the processing chamber 150 and includes a gas supply 104 and a control circuit 202. The delivery of backside gas from the supply 104 to the area 158 is regulated by the control circuit 202. At least one shut-off valve 106 is provided between the supply 104 and the control circuit 202. It is contemplated that the shut-off valve 106 may be an integral part of the control circuit 202.

The control circuit 202 generally includes a first pressure sensor 290, a second pressure sensor 214 (optional), a flow sensor 210, control valve 212, a third pressure sensor 216, and a bypass control branch 218. It is contemplated that the control circuits described herein may be readily adapted for use in other applications, such as chamber pressure control, process gas delivery and the like.

An inlet line 220 is coupled to an inlet of the flow sensor 210 and facilitates coupling the control circuit 202 to the shut-off valve 106. The flow sensor 210 provides a metric indicative of flow $F_S$ passing into the control circuit 202. The flow sensor 210 may be a thermal based technology (most common), a delta pressure based technology, a correolis technology, or any other technology capable of providing mass flow rate. The first pressure sensor 290 is coupled to the inlet line 220 and is adapted to provide a metric indicative of the pressure $P_U$ upstream of the flow sensor 210. The first pressure sensor 290 can be used to ensure that the output of the flow sensor 210 during upstream pressure perturbations accurately reports the flow through the flow sensor 210.

A first intermediate line 222 couples an outlet of the flow sensor 210 to the control valve 212. The first intermediate line 222 has a predetermined volume $V_S$. The predetermined volume $V_S$ may be calculated or measured. The optional second pressure sensor 214 is coupled to the first intermediate line 222 and is adapted to provide a metric indicative of the pressure $P_S$ within the volume $V_S$.

A second intermediate line 224 couples an outlet of the control valve 212 to an outlet line 226 of the control circuit 202. A supply line 228 couples the outlet line 226 to the passage 156 and allows gas, regulated by the control circuit 202, to be delivered to the area 158 between substrate 154 and substrate support 152.

The bypass control branch 218 includes a restrictor 230 and a bypass valve 232 coupled in parallel. A bypass inlet line 234 is teed to junction of the second intermediate line 224 and outlet line 226, and is coupled to the inlets of the restrictor 230 and the bypass valve 232. A bypass outlet line 236 couples the outlets of the restrictor 230 and the bypass valve 232 to a vacuum source 116. The restrictor 230 is set or selected to have a predefined orifice such that a chocked condition is achieved where $P_W$ (described below) is greater than 2 times the vacuum provided by the vacuum source 116. The restrictor 230 may be factory set to this condition, or set on site by a technician or tool operator. With the restrictor 230 set to this condition, $P_W$ sensed by the pressure sensor 216 is also indicative of the pressure in the area 158 below the substrate 152.

The bypass valve 232 may be opened to allow quick evacuation and pressure drop within the control circuit 202. This allows for quick reductions in pressure Pw to be realized in a short amount of time and as a result significantly reduce process times associated with long delays that are required with the existing technology.

A predetermined control volume $V_W$, defined by the gas conduits with a dashed line 240, includes the volumes of the second intermediate line 224, the bypass inlet line 234, the outlet line 226, the supply line 228, the passage 156 and the area 158. The control volume $V_W$ may be calculated or measured. The third pressure sensor 214 is coupled to at least one of the gas conduits comprising the control volume $V_W$ and is adapted to provide a metric of pressure $P_W$ of the gas within the control volume $V_W$. In the embodiment depicted in FIG. 2, the third pressure sensor 214 is coupled to the second intermediate line 224.

To facilitate control of the control circuit 202 as described above, a controller 260 comprising a central processing unit (CPU) 262, support circuits 266 and memory 264, is coupled to the control circuit 202. The controller 260 may additionally control processes performed in the processing chamber 150. The CPU 262 may be one of any form of computer processor that can be used in an industrial setting for controlling various chambers and subprocessors. The memory 264 is coupled to the CPU 262. The memory 264, or computer-readable medium, may be one or more of readily available memory such as random access memory (RAM), read only memory (ROM), floppy disk, hard disk, or any other form of digital storage, local or remote. The support circuits 266 are coupled to the CPU 262 for supporting the processor in a conventional manner. These circuits include cache, power supplies, clock circuits, input/output circuitry, subsystems, and the like.

In operation, a desired pressure set point $P_W$ is selected. The flow sensor 210, and pressure sensors 290, 214, and 216 respectively provide a metric of flow and pressure to the controller 260.

As the volumes $V_S$ and $V_W$ are known for the volumes corresponding to the pressure sensed by the pressure sensors 214, 216, a flow $F_A$ of gas the flow to area 158 between the substrate 154 and substrate support 152 and through the bleed restrictor 230 may be expressed as:

$$F_A = F_S + F_{\Delta P_S}\left(\frac{dP_S}{dt}, V_S\right) - F_{\Delta P_W}\left(\frac{dP_W}{dt}, V_W\right) - F_{deltaP}(dP_u/dt) \quad (1)$$

and $$F_W = F_A - F_{BLEED}(P_W) \quad (2)$$

where:

$F_{BLEED}$ is the flow through the bypass outlet line 236 (typically factory calibrated as a function of $P_W$), $F_W$ is the flow measured to the area 158 between the substrate 154 and substrate support 152 through the outlet line 226 of the control circuit 202, and $F_A$ is the flow measured by the flow sensor 210; and in embodiments where a second pressure sensor is not utilized, $F_{\Delta P_W}(dP_w/dt, V_W)$ is zero.

Knowing $F_W$ and $P_W$ provides more accurate characterization of the heat transfer conditions between the substrate 154 and substrate support 152. The leak rate of backside gas from under the substrate 154 can now be quantified and associated with process conditions such as heat transfer uniformity, substrate chucking characteristics and wear of the substrate support.

Figure 3:
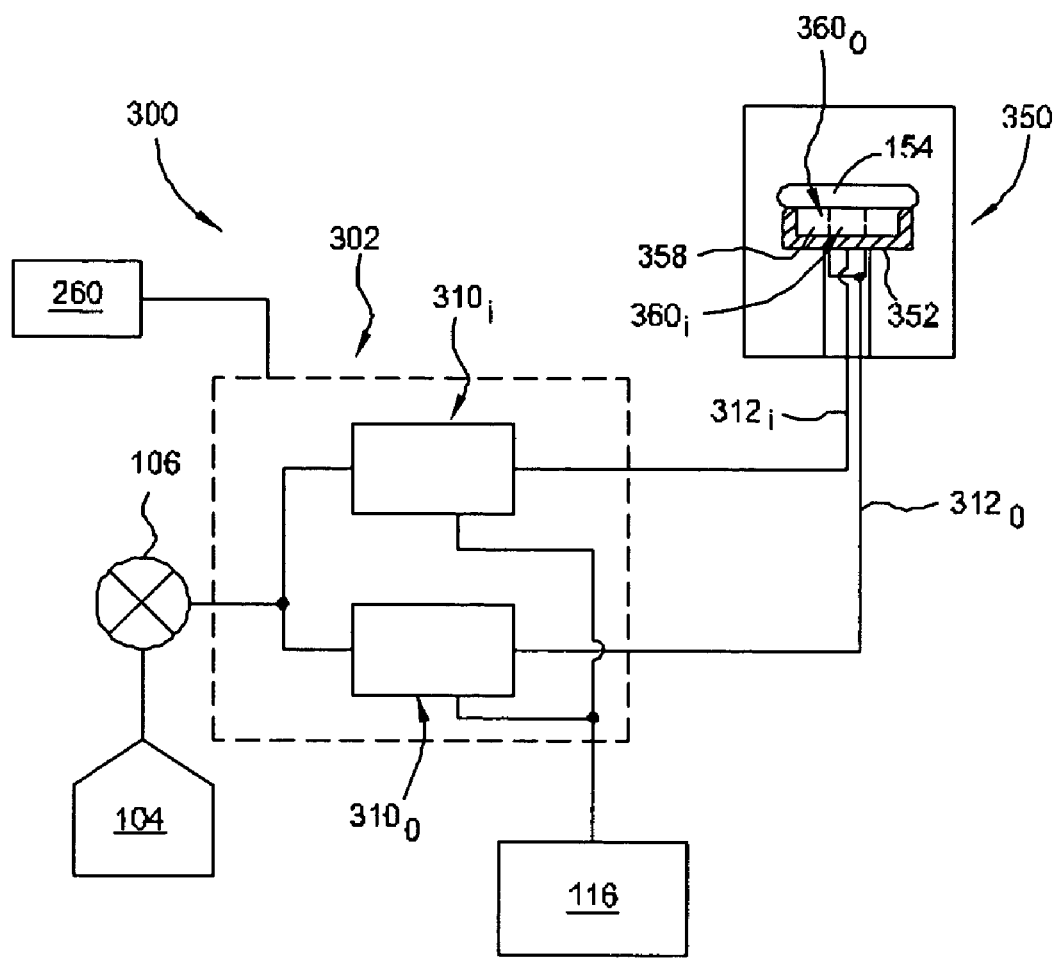
FIG. 3 is a simplified schematic of another embodiment of a control circuit of a gas delivery system coupled to a processing chamber.

FIG. 3 is a simplified schematic of another embodiment of a control circuit 302 of a gas delivery system 300 coupled to a processing chamber 350. The control circuit 302 has a plurality of outlet lines $312_i$ thereby enabling control of multiple gas flows from a single control circuit 302. The subscript "i" used herein is a positive integer. The gas delivery system 300 is similar to the system 100 described above, having a gas supply 104, a shut-off valve 106 and a vacuum source 116.

The processing chamber 350 is similar to the processing chamber 150 described above, except wherein a substrate support 352 disposed in the processing chamber 350 includes multiple zones $360_i$ of backside gas pressure control. Each zone $360_i$ defined in an area 358 between the substrate 154 and the substrate support 352 has gas supplied thereto by at least one of the outlet lines $312_i$. In the embodiment depicted in FIG. 3, the substrate support 352 has two zones $360_0$ and $360_i$ supplied by output lines $312_0$, $312_i$.

The control circuit 302 includes a plurality of sub-circuits $310_i$. The sub-circuits $310_i$ are configured similar to the circuits 102 described above and share the gas supply 104 and vacuum source 116. It is contemplated that one or more of the sub-circuits $310i$ may a dedicated gas supply and vacuum source. Each of the sub-circuits $310i$ controls the flow through a respective outlet line $312_i$. In each of the circuits $310_i$, the conductance downstream of the bypass control branch 218 (referring additionally to FIG. 2) must ensure $P_W$ is 2 times greater than vacuum provided by the vacuum source 116 when all the outlets lines $312_i$ are at maximum flow or when all of the lines $312_i$ are flowing to the vacuum source 116 through the bypass valve 232.

Figure 4:
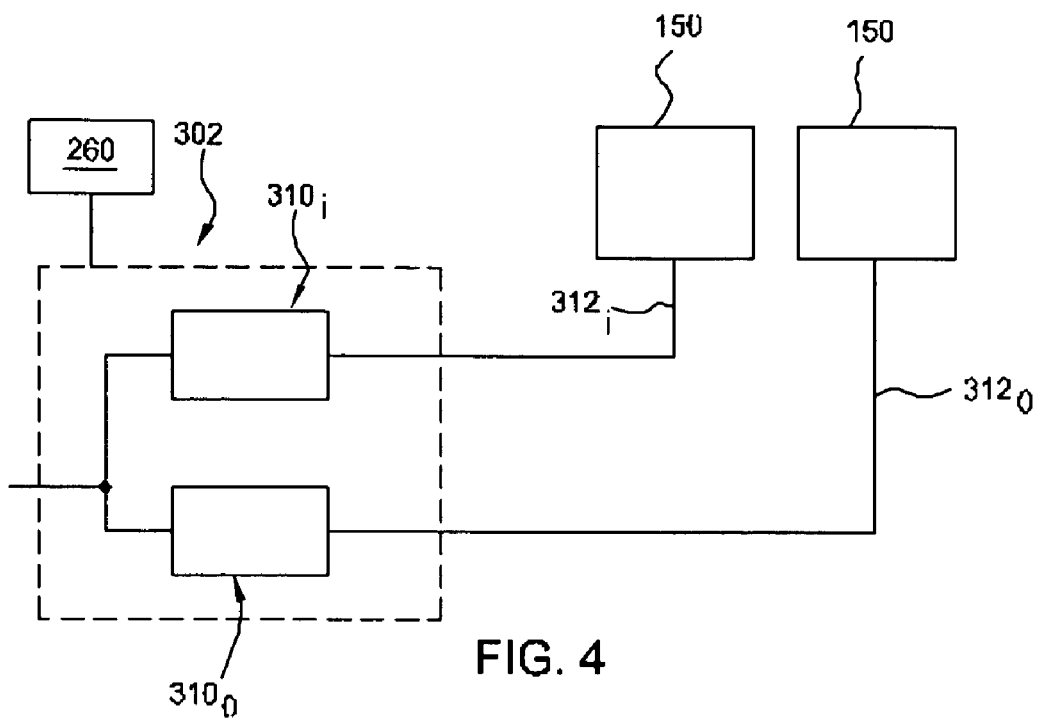
FIGS. 4–6 are simplified schematics of alternative embodiments of a gas delivery system.

The control circuit 202 may be coupled to multiple substrates supports in other configurations. For examples, FIG. 4 depicts the control circuit 302 coupled to two processing chambers. Although one output line $312_i$ is shown coupled to each processing chamber 150, it is contemplated that the processing chamber may include substrates supports having multi-zone backside gas delivery, as discussed with reference to FIG. 3. In such a configuration, the circuit 302 may be configured to provide gas through multiple output lines $312_i$ to each chamber.

Figure 5:
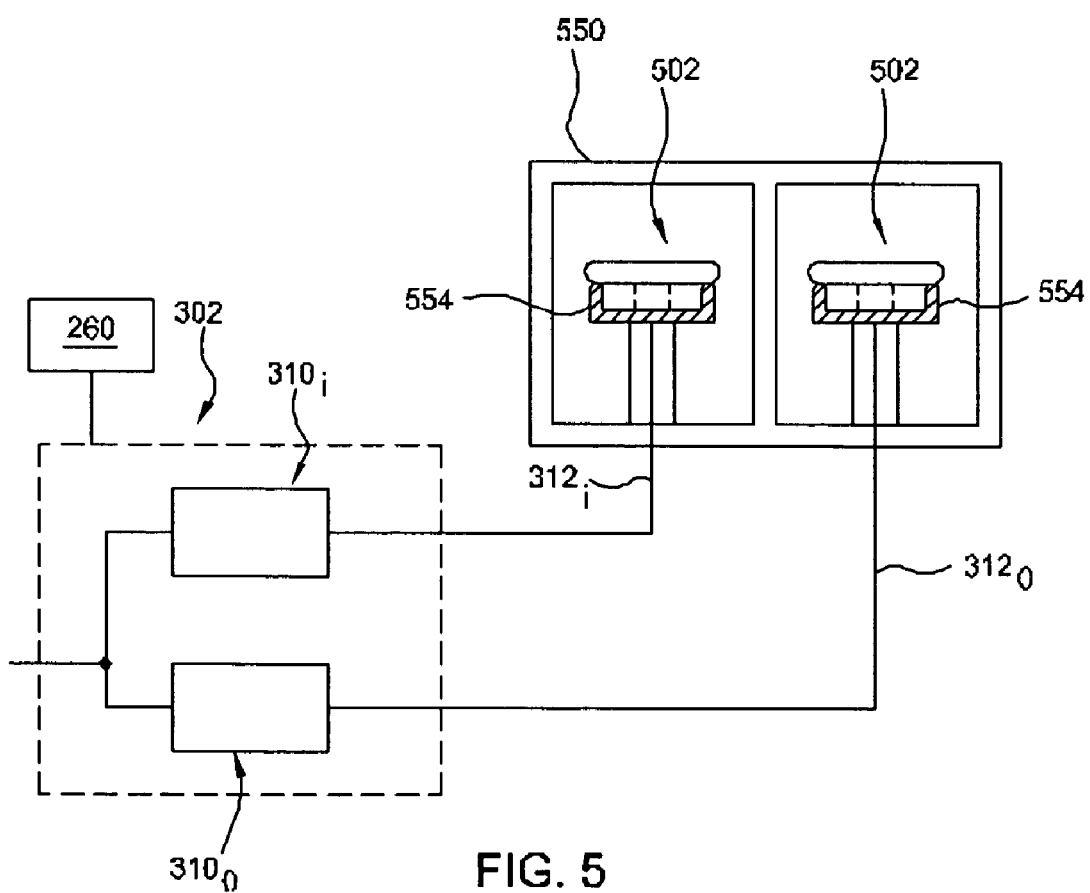

In another example depicted in FIG. 5, the control circuit 302 may be coupled to a single processing chamber 550 having multiple processing regions 502. An example of a processing chamber available in this configuration is a PRODUCER® processing chamber, available from Applied Materials, Inc., located in Santa Clara, Calif. In the embodiment depicted in FIG. 5, one output line $312_i$ is shown coupled to each substrate support 554 disposed in each processing region 502. It is contemplated that the substrates supports 554 may include multizone backside gas delivery, as discussed with reference to FIG. 3. In such a configuration, the circuit 302 may be configured to provide gas through multiple output lines $312_i$ to each substrate support. It is contemplated that a first output line $312_i$ may be teed to supply a first zone in a predefined number of substrate supports, while a second output $312_i$ may be teed to supply a second zone in each of the substrate supports, wherein the substrate supports are disposed in the same or different processing chambers.

Figure 6:
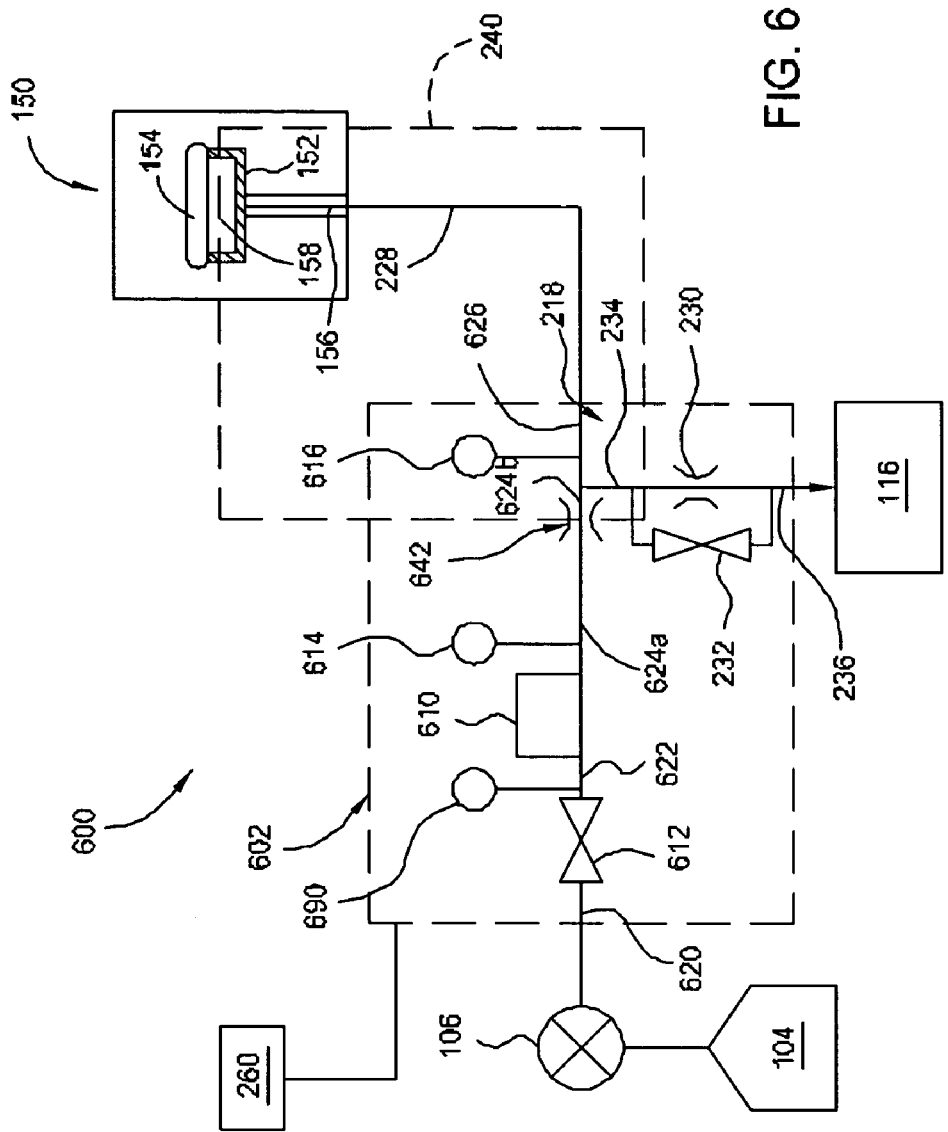
Figure 7:
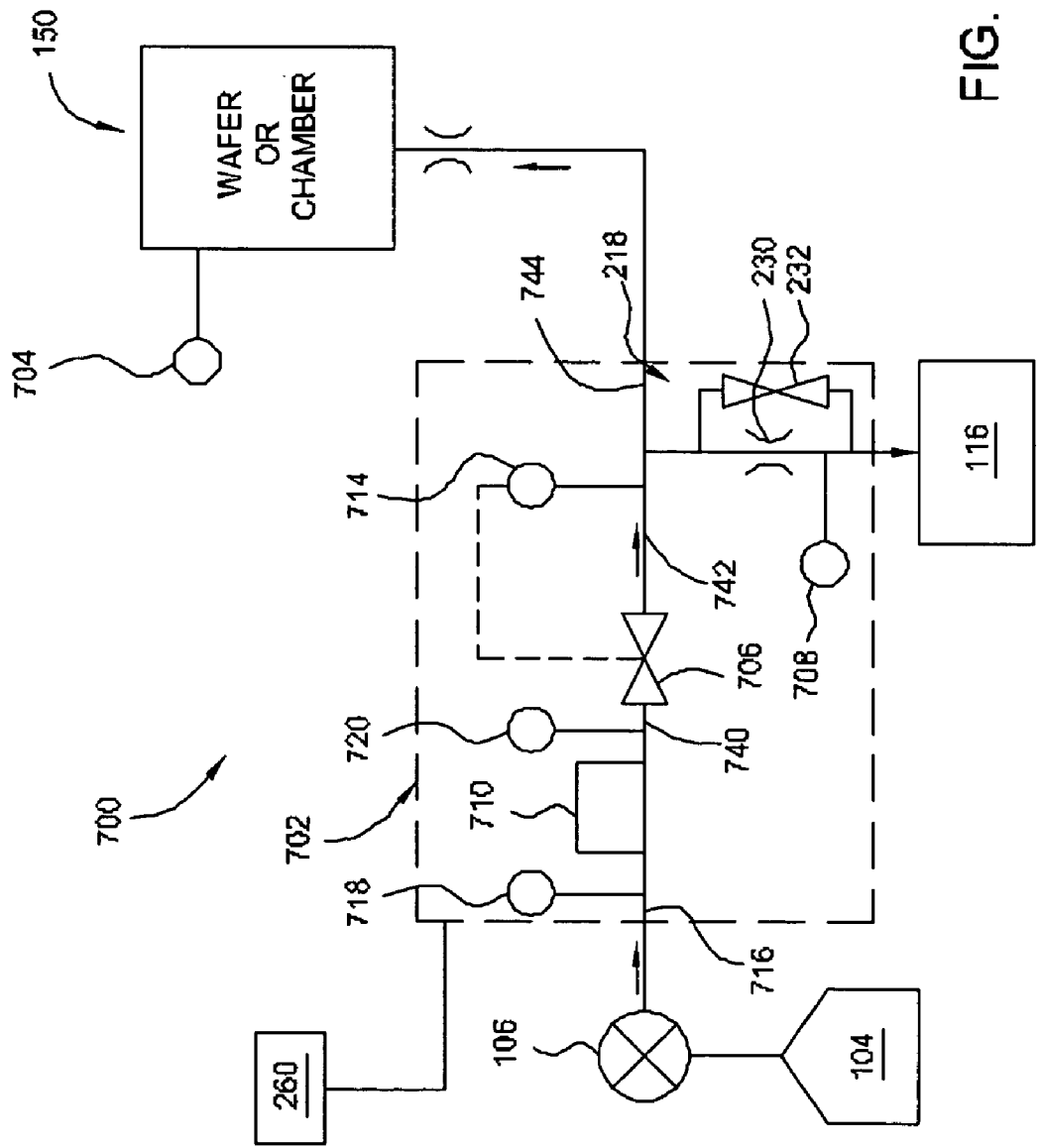
FIGS. 7–8 are simplified schematics of alternative embodiments of a control circuit.
Figure 8:
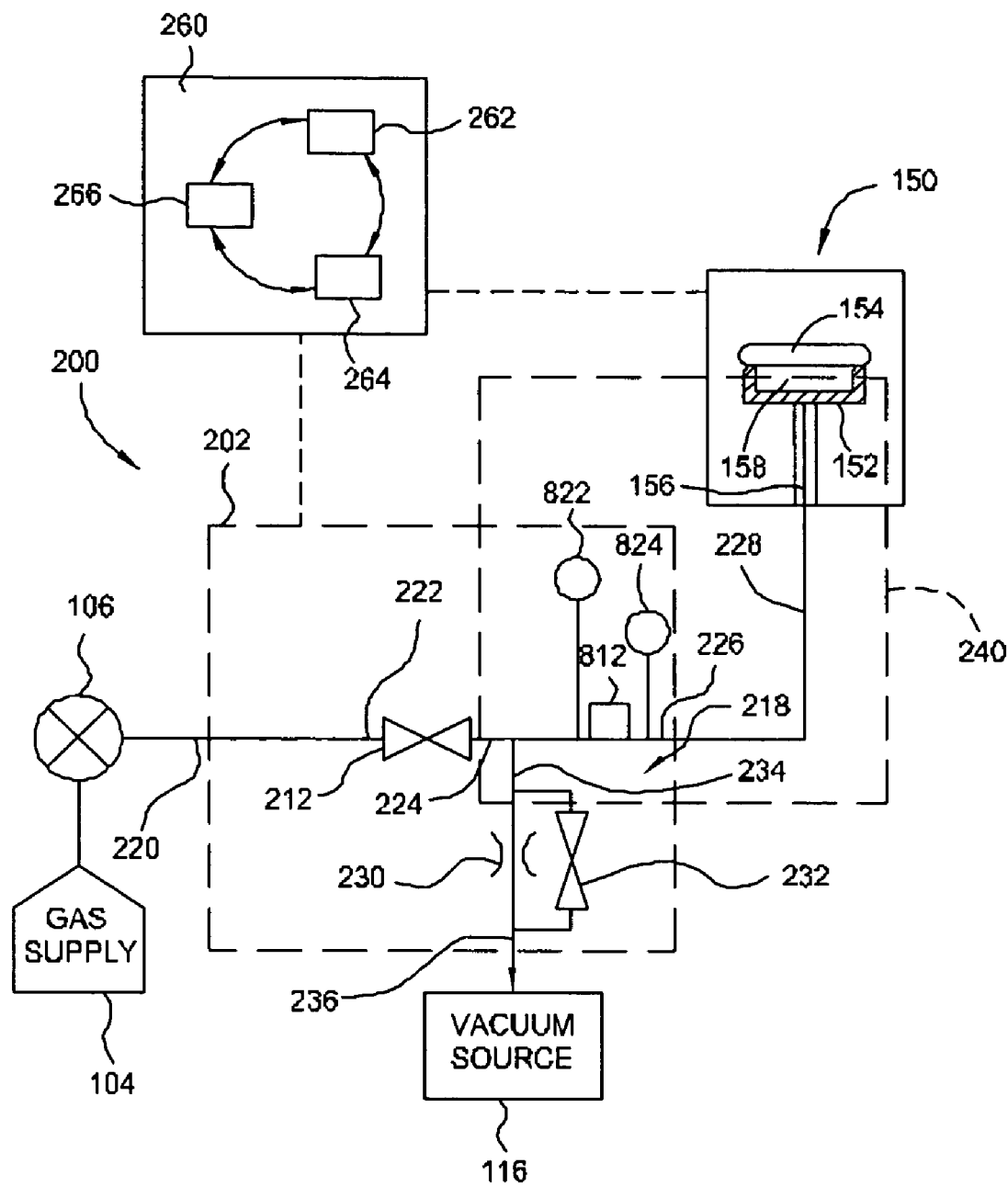

FIGS. 6–8 depict alternative embodiments of control circuits. It is contemplated that any of the control circuits described in FIGS. 6–8 may include multiple sub-circuits as described with reference to FIG. 3, or be coupled one or more substrate supports having one or more backside gas zones as described with reference to FIGS. 4–5.

FIG. 6 is a simplified schematic of another embodiment of a gas delivery system 600 of the invention coupled to a processing chamber 150. The processing chamber 150 has been described above.

The gas delivery system 600 includes a gas supply 104 and a control circuit 602. The delivery of backside gas from the supply 104 to the area 158 between the substrate 154 and substrate support 152 is regulated by the control circuit 602. The control circuit 602 generally includes a flow sensor 610, control valve 612, a first pressure sensor 690, a second pressure sensor 614, a third pressure sensor 616 and a bypass control branch 218.

An inlet line 620 couples the inlet of the control valve 612 to the shut-off valve 106. A first intermediate line 622 couples an outlet of the control valve 612 to the flow sensor 610. The control valve 612 and flow sensor 610 may be similar to the control valve 216 and flow sensor 210 described above.

The first pressure sensor 690 is coupled to the first intermediate line 622 and is adapted to provide a metric indicative of the pressure $P_U$ upstream of the flow sensor 610. The first pressure sensor 690 can be used to ensure that the output of the flow sensor 610 during upstream pressure perturbations accurately reports the flow through the flow sensor 610.

A second intermediate line (shown as portions 624a, 624b) couples an outlet of the flow sensor 610 to an outlet line 626 of the control circuit 602. A supply line 228 couples the outlet line 626 to the passage 156 and allows gas, regulated by the circuit 602, to be delivered to the area 158 between substrate 154 and substrate support 152.

A restrictor 642 separates the portions 624a, 624b of the second intermediate line. The restrictor 642 may have a fixed or variable orifice, and generally provides sufficient back pressure to accommodate the operational parameters of the flow sensor 610. As such, with some flow meters, use of the restrictor 642 may not be required.

The first portion 624a couples the flow sensor 610 to the restrictor 642. The first portion 624a has a predetermined volume $V_S$. The predetermined volume $V_S$ may be calculated or measured. The second pressure sensor 614 is coupled to the first portion 624a of the second intermediate line and is adapted to provide a metric indicative of the pressure $P_S$ within the volume $V_S$.

The second portion 624b runs from the restrictor 642 to at tee joining the outlet line 626 and bypass control branch 218. The bypass control-branch 218 includes a bypass inlet line 234 that couples the outlet line 226 and second portion 624b of the second intermediate line to the inlets of a restrictor 630 and a bypass valve 232. The bypass control branch 218 is configured and generally functions as described above.

A predetermined control volume $V_W$, defined by the gas conduits with a dashed line 240, includes the volumes of the second portion 624b of the second intermediate line, the bypass inlet line 234, the outlet line 626, the supply line 228, the passage 156 and the area 158. The control volume $V_W$ may be calculated or measured. The second pressure sensor 614 is coupled to the at least one of the gas conduits comprising the control volume $V_W$ and is adapted to provide a metric of pressure $P_W$ of the gas within the control volume $V_W$. In the embodiment depicted in FIG. 6, the second pressure sensor 614 is coupled to the second portion 624b of the second intermediate line.

In operation, a desired pressure set point $P_W$ is selected and the valve 106 is opened to provide a flow of gas from the supply 104 to the control circuit 602. The flow sensor 610, and pressure sensors 690, 614, 616 respectively provide a metric of flow and pressure to the controller 260. The pressure sensors 690, 614, 616 upstream and downstream of the control valve 612 prevent transient pressure changes upstream and downstream of the flow sensor 610 or in $V_w$ of the control valve 612 from effecting the flow measurements provided by the flow sensor 610.

As the volumes $V_S$ and $V_W$ are known for the volumes corresponding to the pressure sensed by the pressure sensors 614, 616, a flow $F_A$ of gas through the second portion 624b of the second intermediate line and a flow $F_W$ of gas to the area 258 between the substrate support 252 and the substrate 254 the may be determined using equations (1) and (2) as discussed above.

FIG. 7 is a simplified schematic of another embodiment of a gas delivery system 700 of the invention coupled to a processing chamber 150. The processing chamber 150 has been described above and may be configured to include a chamber pressure sensor 704 that is adapted to provide a metric indicative of the actual pressure $P_C$ within the chamber 150. The gas delivery system 700 shown in FIG. 7 for regulating chamber pressure, or the flow of gas into a process volume within the chamber, may also be configured to provide backside gas to the substrate support within the processing chamber. The chamber pressure sensor 704 is not needed at this location for back side cooling applications where the effective restriction $R_W$ between control circuit 702 and substrate 254 or processing chamber 150 is relatively large and the actual flow $F_{W/C}$ through the effective restriction $R_W$ to the chamber 150 is relatively small. In chamber pressure control $P_C$ is needed when $R_W$ is relatively small and $F_{W/C}$ is relatively large and feedback to the control valve 706 is provided from the chamber pressure sensor 704.

The gas delivery system 700 includes a gas supply 104 and a control circuit 702. The delivery of gas from the supply 104 to the chamber 150 is regulated by the control circuit 702 based on feedback from the chamber pressure sensor 704. The control circuit 702 generally includes a control valve 706, a flow sensor 710, an upstream pressure sensor 718, and may also require a downstream pressure sensor 720 and a primary pressure sensor 714.

An input line 716 couples the gas delivery system 702 to the shut-off valve 106. The input line 716 is connected to the flow sensor 710 that is adapted to provide a metric indicative of flow $F_{W/CB}'$ through the flow sensor 710 placed upstream of the control valve 706. In the chamber pressure control application this may be the sum of two or more sensors and control valves and may require control of the ratio of these sensors. In the embodiment depicted in FIG. 7, only one flow sensor 710 and control valve 706 are shown.

A first pressure sensor 718 is provided upstream of the flow sensor 710 and adapted to provide a metric indicative of a pressure $P_{US}$. The first pressure sensor 718 can be used to ensure the flow sensor output during upstream pressure perturbations so that accurate determination of the flow through the flow sensor 710 can be made.

A second pressure sensor 720 is provided downstream of and adjacent to the flow sensor 710 and adapted to provide a metric indicative of a pressure $P_{DS}$. The second pressure sensor 720 may be necessary for measuring the pressure if transient pressure changes in the volume $V_{DS}$ defined in a first intermediate line 740 connecting the flow sensor 710 and the control valve 706 (i.e. $dP_{DS}/dt$). In such a condition, the flow sensor output may not be equal to the actual flow through the restriction downstream of the flow sensor (i.e. the control valve 706).

The second intermediate line 742 couples an outlet of control valve 706 to a tee between an outlet line 744 and the bypass control branch 218. The outlet line 744 is coupled through a passage to the chamber 150.

The primary pressure sensor 714 may be necessary to provide a metric indicative of a pressure $P_{WB}$ of the flow within the outlet line 744. The output from the primary pressure sensor 714 may be necessary to augment the flow sensor output, as transient changes in pressure within Vw will result in differences between Fw/cb' and Fw/c.

The bypass control branch 218 includes a pressure sensor 708 is adapted to provide a metric indicative of a pressure $P_B$ downstream of the bleed restrictor $R_B$ and the bypass valve 232. To reduce cost, the pressure sensor 708 may be optionally omitted and the pressure $P_B$ is assumed to be $<\frac{1}{2} P_{WB}$.

The restrictor 230 provides the effective restriction $R_B$ of bleed flow. The restrictor 230 is sized such that flow through the restrictor 230 is chocked. The restrictor 230 may not be needed for the chamber control application where $F_{W/C}$ is relatively large. $F_B$ is the flow through the bypass control branch 218 to the vacuum source 116.

The control circuit 702 can be used to calculate a volume $V_W$ defined as that volume between the chamber restriction Rw, the bypass control branch 218, and the control valve 706. If shut-off valves are added at all ports of the control circuit to isolate its internal volume and the total internal volume of the control circuit $V_1$ (as isolated by these shut-off valves) is known. In this configuration the controller 260 must run through the following steps to determine $V_W$:

Step 1: Pressurize the control circuit;
Step 2: Isolate the control circuit volume from the inlet pressure source;
Step 3: Open the shut-off valve on the w/c port. Note: A valve at the chamber must be added and closed during this operation; and
Step 4: After pressure in the control circuit volume has stabilized, $V_W$ may be expressed as $V_W=(V_1(P_1/P_2-1))$– sum of: volume between the bleed restriction/dump valve and bleed port shut off valve; volume between the first restrictor upstream of $P_{WB}$, and the supply port shut off valve.

The control valve must be open during this routine. Alternatively, $V_W$ can be determined empirically or via computer modeling for each application and input as a constant into the control circuit 702.

The flow output from this device must be resolved to provide $F_{W/CB}$ and $F_{W/C}$ and $F_B$. In chamber pressure control applications it may also be necessary to provide and control a ratio of gases as the flow from $F_{W/CB}'$ may be the sum of two or more flow controllers. The following are examples of considerations that must be made when resolving these flows:

$F_{W/CB}=F_{W/CB}'$–TFDS; where TFDS is the transient flow into $V_{DS}$ associated with changes in pressure in $V_{DS}$ and is a function of $V_{DS}$ and $dP_{DS}/dt$ and governed by PV=nRT. $F_{W/CB}'$ must not be impacted by changes in pressure upstream of the flow sensor and is a function of $dP_{US}/dt$.

$F_{W/C}=F_{W/CB}-F_B$–TFW; where $F_B$ is the bleed flow through the restrictor $R_B$ and TFW is the transient flow in $V_W$ associated with changes in pressure in $V_W$ and is a function of $V_W$ and $dP_{WB}/dt$. TFW may be ignored and the need for Pwb may be eliminated if Vw can be made small enough such that these values are negligible when compared to Fw/c.

$F_B$ is only a function of $P_{WB}$ when $P_{WB}>2 P_D$ (i.e. chocked flow) because $R_B$ is designed such that during these conditions ($P_{WB}>2P_D$), the flow $F_B$ is chocked. $F_B$ is characterized as a function of $P_{WB}$ in production to account for any variation in manufacturer of $R_B$. $F_B$ may be zero in chamber pressure control application where $F_{W/C}$ is relatively large.

where:

$V_W$ is a volume between the $R_W$, the bleed restrictor ($R_B$), and the control valve 706;

$R_F$ is the effective restriction of flow sensing technology; and $F_{W/CB}$ is the sum of the flow $R_B$ through the bleed restrictor; the flow Fw/c through the total effective restriction to the chamber, and the transient flow into $V_W$ associated with changes in pressure ($dP_{WB}/dt$).

FIG. 8 is a simplified schematic of another embodiment of a gas delivery system 800 of the invention coupled to a processing chamber 150. The gas delivery system 800 is essentially identical to the system 600 described above, except wherein a flow sensor 812 is positioned downstream of the bypass control branch 218 with pressure sensors 822, 824 positioned to detect the pressure on the immediate upstream and downstream sides of the flow sensor 812. Although the bypass control branch 218 is shown teed between the pressure sensor 822 and the control valve 212, the bypass control branch 218 may be positioned in other positions downstream of the control valve 212.

In this embodiment, the first pressure sensor 822 is necessary for measuring the pressure $P_{US}$ upstream of the flow sensor 822 to ensure the flow sensor 812 output is accurate during upstream pressure perturbations, including flow changes through the bypass control branch 218, are accurately reported by the flow sensor 812. The first pressure sensor 822 is utilized to resolve the flow through the bypass restrictor 230. Bleed flow through the restrictor 230 is chocked as described above. The $F_{W/C}$ may be resolved as described with reference to the embodiment of FIG. 7.

The following are examples of considerations that must be made when resolving these flows in a device which has the flow sensor downstream of the control valve and downstream of the branch to the bleed restrictor:

$F_{W/CB}=F_{W/C}'+F_B$–TFUS where $F_B$ is the bleed flow through the restrictor $R_B$. TFUS is the transient flow into $V_{US}$ associated with changes in pressure in $V_{US}$ and is a function of $V_{US}$ and $dP_{US}/dt$ and governed by PV=nRT. $F_{W/C}'$ must not be impacted by changes in pressure upstream of the flow sensor and is a function of $dP_{US}/dt$.

$F_{W/C}=F_{W/C}'$–TFDS; where TFDS is the transient flow in $V_{DS}$ associated with changes in pressure in $V_{DS}$ and is a function of $V_{DS}$ and $dP_{DS}/dt$.

$F_B$ is only a function of $P_{US}$ when $P_{US}>2 P_B$ (i.e. chocked flow) because $R_B$ is designed such that during these conditions (Pus>2PB) flow $F_B$ is chocked. $F_B$ is characterized as a function of $P_{US}$ in production to account for any variation in manufacturer of $R_B$.

Thus, gas delivery systems having control circuit that advantageously enable characterization of the heat transfer conditions between the substrate and substrate support have been provided. The innovative control circuits enable the determination of the pressure and flow rates of gas flowing to the backside of the substrate. Accuracy of backside gas flow control has been improved over the state of the art. Moreover, quick and efficient purging of the control circuit and passages leading to the substrate support is enabled. It is also contemplated that the gas delivery system may be configured to supply gas to other aspects of the processing system. For example, the gas delivery system may be utilized to at least partially regulate or control chamber pressures, or to deliver at least one of process gases, purge gases, cleaning agents, or carrier gases among others.

While the foregoing is directed to embodiments of the present invention, other and further embodiments of the invention may be devised without departing from the basic scope thereof, and the scope thereof is determined by the claims that follow.

What is claimed is:

1. Apparatus for gas control, comprising:
   at least a first control valve having an inlet connected to a first gas line adapted for coupling to a gas supply;
   a flow sensor coupled to an outlet of the control valve;
   a second gas line coupled to an outlet of the control valve and the inlet of the flow sensor;

an upstream pressure sensor coupled to the second gas line and adapted to sense a metric indicative of pressure within the second gas line,
a third gas line coupled to an outlet of the flow sensor; and
a downstream pressure sensor coupled to the third gas line and adapted to sense a metric indicative of pressure within the third gas line.

2. The apparatus of claim 1 further comprising:
a restrictor disposed in the third gas line;
an intermediate pressure sensor coupled to the third gas line upstream of the restrictor and adapted to sense a metric indicative of pressure within the third gas line upstream of the restrictor.

3. The apparatus of claim 2 further comprising:
a bypass line coupled to the third gas line down stream of the restrictor.

4. The apparatus of claim 1 further comprising:
a restrictor disposed between the third gas line and downstream pressure sensor.

5. Apparatus for gas control, comprising:
at least a first flow sensor having an inlet adapted for coupling to a gas supply by a first gas line;
a control valve;
a second gas line coupled to an outlet of the flow sensor and an inlet of the control valve;
a third gas line coupled to an outlet of the control valve;
an upstream pressure sensor coupled to the first gas line and adapted to sense a metric indicative of pressure within the first gas line;
a downstream pressure sensor coupled to the third gas line and adapted to sense a metric indicative of pressure within the third gas line; and
an intermediate pressure sensor adapted to provide a metric of pressure in the second gas line, wherein a flow of gas passing through the second gas line may be expressed as:

$$F_A = F_S + F_{\Delta P_S}\left(\frac{dP_S}{dt}, V_S\right) - F_P(dP/dt)$$

where:
$F_S$ is the flow sensed by the flow sensor;
P is the pressure sensed in the first gas line;
$P_S$ is the pressure sensed in the second gas line; and
$V_S$ is the volume between flow sensor and the control valve in the second gas line.

6. The apparatus of claim 5, further comprising:
a bypass control branch teed to the third gas line and having a bypass restrictor;
a bypass valve coupled in parallel to the bypass restrictor; and
a vacuum source coupled in parallel to outlets of the bypass restrictor and the bypass valve.

7. The apparatus of claim 6, further comprising:
a bypass pressure sensor coupled to the bypass control branch and adapted to sense a metric indicative of pressure within the bypass control branch.

8. Apparatus for gas control, comprising:
at least a first flow sensor having an inlet adapted for coupling to a gas supply by a first gas line;
a control valve;
a second gas line coupled to an outlet of the flow sensor and an inlet of the control valve;
a third gas line coupled to an outlet of the control valve;

an upstream pressure sensor coupled to the first gas line and adapted to sense a metric indicative of pressure within the first gas line;
a downstream pressure sensor coupled to the third gas line and adapted to sense a metric indicative of pressure within the third gas line; and
an intermediate pressure sensor coupled to the second gas line and adapted to sense a metric indicative of pressure within the second gas line, wherein a flow of gas passing through an outlet of the apparatus downstream of the downstream pressure sensor may be expressed as:

$$F_W = F_A - F_{BLEED}(P_W)$$

where:
$F_A$ is the flow measured by the flow sensor;
$F_{BLEED}$ is the flow to the vacuum source; and
$P_W$ is the pressure sensed in the third gas line.

9. The apparatus of claim 8, wherein the flow of gas to the vacuum source is at least one of measured or factory calibrated.

10. Apparatus for gas control, comprising:
at least a first control valve having an inlet adapted for coupling to a gas supply;
a flow sensor coupled to an outlet of the control valve;
a first gas line coupled to an outlet of the control valve and the inlet of the flow sensor;
an upstream pressure sensor couple to the first gas line and adapted to sense a metric indicative of pressure within the first gas line,
a second gas line coupled to an outlet of the flow sensor;
a downstream pressure sensor coupled to the second gas line and adapted to sense a metric indicative of pressure within the second gas line; and
a bypass line coupled to the second gas line down stream of the restrictor, wherein the bypass line further comprises:
a bypass restrictor; and
a bypass valve coupled in parallel.

11. The apparatus of claim 10, further comprising:
a vacuum source coupled in parallel to outlets of the restrictor and bypass valve.

12. The apparatus of claim 11, wherein the vacuum source provides a pressure at least 2 times less than a pressure in the second gas line.

13. The apparatus of claim 12, further comprising:
an intermediate pressure sensor adapted to provide a metric of pressure in the second gas line, wherein a flow of gas passing through the first gas line may be expressed as:

$$F_A = F_S + F_{\Delta P_S}\left(\frac{dP_S}{dt}, V_S\right) - Fpu(dPu/dt, Vu)$$

where:
$F_S$ is the flow sensed by the flow sensor;
$P_u$ is the pressure sensed in the first gas line;
$V_u$ is the volume between the between the flow sensor and the control valve in the first gas line;
$P_S$ is the pressure sensed in the second gas line; and
$V_S$ is the volume between flow in the second gas line.

14. The apparatus of claim 13, further comprising a bypass control branch teed to the second gas line.

15. The apparatus of claim 14, wherein a flow of gas passing through an outlet of the apparatus teed to the second gas line and bypass line may be expressed as:

$$F_W = F_A - F_{BLEED}(P_W)$$

where:
$F_A$ is the flow measured by the flow sensor; and
$F_{BLEED}$ is the flow to the vacuum source.

16. The apparatus of claim 15, wherein the flow of gas to the vacuum source is at least one of measured or factory calibrated.

17. The apparatus of claim 15, further comprising:
a restrictor disposed in the second gas line; and
an intermediate pressure sensor coupled to the second gas line and adapted to sense a metric indicative of pressure within the second gas line upstream of the restrictor.

18. The apparatus of claim 10, further comprising an outlet gas line.

19. The apparatus of claim 18, wherein the outlet gas line is coupled to a processing chamber.

20. The apparatus of claim 11, further comprising a bypass control branch teed between the control valve and the flow sensor.

21. Apparatus for gas control, comprising:
at least a first flow sensor having an inlet adapted for coupling to a gas supply by a first gas line;
a control valve;
a second gas line coupled to an outlet of the flow sensor and an inlet of the control valve;
a third gas line coupled to an outlet of the control valve;
an upstream pressure sensor coupled to the first gas line and adapted to sense a metric indicative of pressure within the first gas line;
a downstream pressure sensor coupled to the third gas line and adapted to sense a metric indicative of pressure within the third gas line; and
a bypass line coupled to the third gas line, wherein the bypass line comprises:
a restrictor sized such that flow is choked and proportional to the downstream pressure sensor; and
a bypass valve coupled in parallel.

22. The apparatus of claim 21, further comprising:
a vacuum source coupled in parallel to outlets of the restrictor and bypass valve.

23. The apparatus of claim 22, wherein the vacuum source provides a pressure at least 2 times less than a pressure in the third gas line.

24. The apparatus of claim 21, wherein the bypass line is disposed downstream of the downstream pressure sensor.

* * * * *

UNITED STATES PATENT AND TRADEMARK OFFICE
CERTIFICATE OF CORRECTION

PATENT NO.         : 7,204,155 B2
APPLICATION NO.    : 11/475805
DATED              : April 17, 2007
INVENTOR(S)        : Lane et al.

Page 1 of 1

It is certified that error appears in the above-identified patent and that said Letters Patent is hereby corrected as shown below:

In the Specification:

In Column 2, Line 49, please delete "pump-to" and insert --pump to--;

In Column 2, Line 50, please delete "gage" and insert --gauge--;

In Column 2, Line 53, please delete "then" and insert --than--;

In Column 7, Line 30, please delete "at" and insert --a--;

In Column 7, Line 32, please delete "control-branch" and insert --control branch--;

In Column 7, Line 64, please delete "the".

In the Claims:

In Column 12, Claim 10, Line 29, please delete "couple" and insert --coupled--;

In Column 12, Claim 13, Line 62, please delete "between the between the" and insert --between the--.

Signed and Sealed this

Seventeenth Day of July, 2007

JON W. DUDAS
*Director of the United States Patent and Trademark Office*